(12) United States Patent
Yu et al.

(10) Patent No.: US 10,269,792 B2
(45) Date of Patent: Apr. 23, 2019

(54) STRUCTURE AND METHOD FOR FINFET DEVICE

(71) Applicant: Taiwan Semiconductor Manufacturing Company, Ltd., Hsin-Chu (TW)

(72) Inventors: Chih-Hao Yu, Tainan (TW); Shao-Ming Yu, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 350 days.

(21) Appl. No.: 15/225,480

(22) Filed: Aug. 1, 2016

(65) Prior Publication Data

US 2016/0343710 A1  Nov. 24, 2016

Related U.S. Application Data

(63) Continuation of application No. 14/318,140, filed on Jun. 27, 2014, now Pat. No. 9,406,782.

(51) Int. Cl.
| | |
|---|---|
| *H01L 27/088* | (2006.01) |
| *H01L 29/66* | (2006.01) |
| *H01L 29/78* | (2006.01) |
| *H01L 27/092* | (2006.01) |
| *H01L 27/108* | (2006.01) |
| *H01L 29/10* | (2006.01) |
| *H01L 29/165* | (2006.01) |
| *H01L 29/423* | (2006.01) |

(52) U.S. Cl.
CPC ...... *H01L 27/0886* (2013.01); *H01L 27/0924* (2013.01); *H01L 27/10879* (2013.01); *H01L 29/1054* (2013.01); *H01L 29/165* (2013.01); *H01L 29/42356* (2013.01); *H01L 29/66795* (2013.01); *H01L 29/785* (2013.01); *H01L 29/7849* (2013.01); *H01L 29/7853* (2013.01)

(58) Field of Classification Search
CPC ............ H01L 29/66795; H01L 29/785; H01L 27/0924; H01L 27/10879; H01L 27/0886; H01L 29/1054; H01L 29/165; H01L 29/42356; H01L 29/7849; H01L 29/7853
See application file for complete search history.

(56) References Cited

U.S. PATENT DOCUMENTS

| | | |
|---|---|---|
| 8,395,195 B2 | 3/2013 | Chang |
| 8,614,127 B1 | 12/2013 | Yang |
| 8,618,556 B2 | 12/2013 | Wu |
| 8,901,607 B2 | 12/2014 | Wang |
| 9,093,302 B2 | 7/2015 | Xie |
| 9,142,651 B1 | 9/2015 | Xie |

(Continued)

*Primary Examiner* — Bac Au
(74) *Attorney, Agent, or Firm* — Haynes and Boone, LLP

(57) ABSTRACT

A semiconductor device includes a first fin structure extending from a semiconductor substrate. A second fin structure is disposed over the first fin structure. The second fin structure includes a first layer including a first semiconductor material. The second fin structure further includes a second layer including a second semiconductor material disposed over the first layer. The second layer has a vertical sidewall. The second semiconductor material is different from the first semiconductor material. A gate structure is disposed over the semiconductor substrate and wraps around the first and second layers of the second fin structure.

20 Claims, 15 Drawing Sheets

(56) References Cited

U.S. PATENT DOCUMENTS

| | | |
|---|---|---|
| 9,142,676 B2 | 9/2015 | Ching |
| 9,214,553 B2 | 12/2015 | Cai |
| 9,236,478 B2 * | 1/2016 | Morand ............ H01L 29/66795 |
| 9,306,069 B2 | 4/2016 | Ching |
| 9,318,606 B2 | 4/2016 | Wang |
| 9,472,446 B2 * | 10/2016 | Xie ................... H01L 21/76224 |
| 9,559,181 B2 * | 1/2017 | Ching ............... H01L 29/66795 |
| 2014/0197458 A1 | 7/2014 | Ching |
| 2015/0179768 A1 | 6/2015 | Chen |
| 2015/0263159 A1 | 9/2015 | Ching |

\* cited by examiner

US 10,269,792 B2

STRUCTURE AND METHOD FOR FINFET DEVICE

PRIORITY DATA

The present application is a continuation application of U.S. patent application Ser. No. 14/318,140, filed Jun. 27, 2014, now U.S. Pat. No. 9,406,782, entitled "STRUCTURE AND METHOD FOR FINFET DEVICE", which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of fabricating FinFET devices have been generally adequate for their intended purposes, they have not been entirely satisfactory in all respects. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
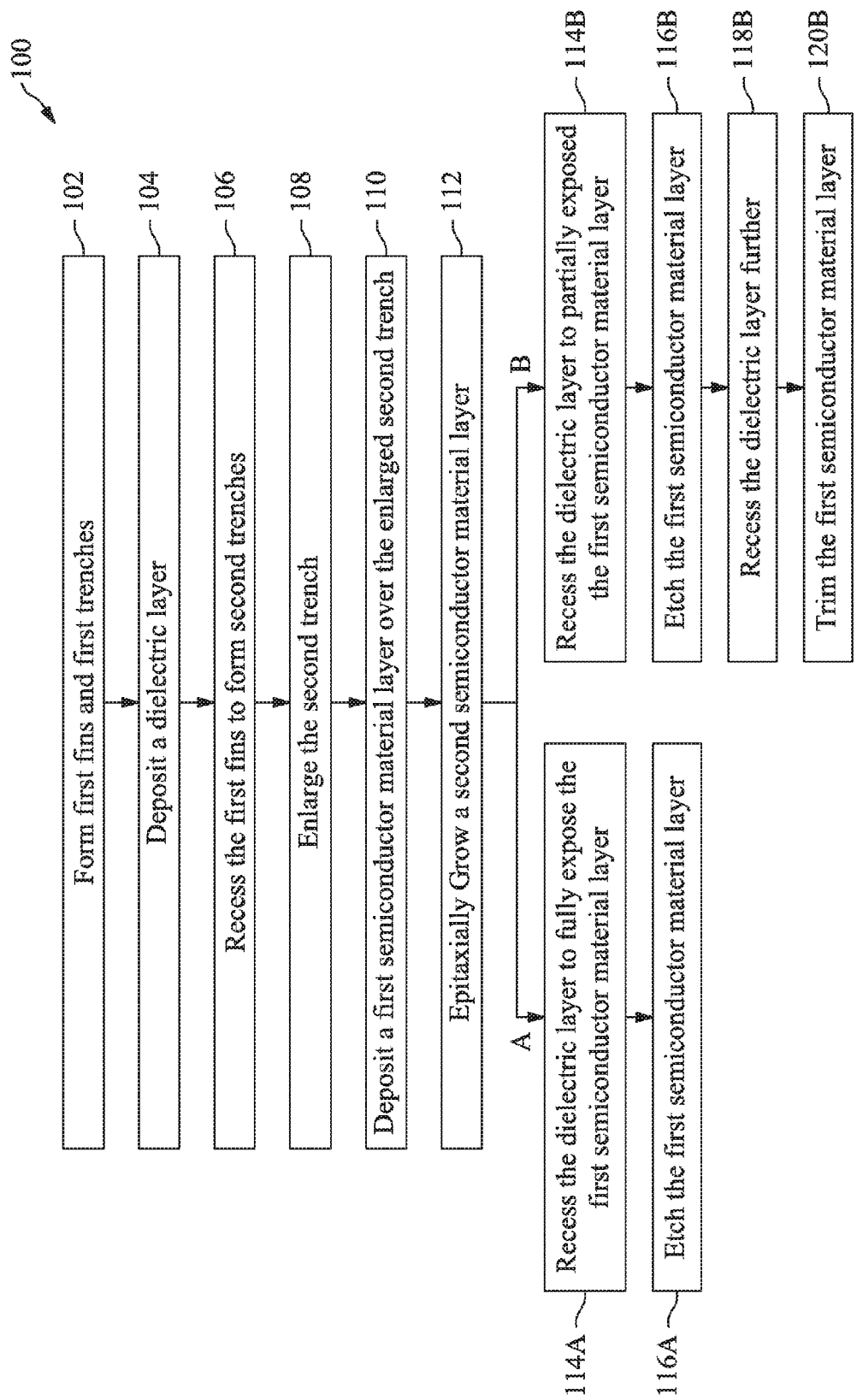
FIG. 1 is a flow chart of an example method for fabricating a FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a FinFET device 200 according to aspects of the present disclosure. FIGS. 2-13 are cross-section views of the FinFET device 200 at fabrication stages constructed according to the method 100 of FIG. 1. The FinFET device 200 is collectively described with reference to FIGS. 1-9. It is understood that additional steps can be provided before, during, and after the method 100, and some of the steps described can be replaced or eliminated for other embodiments of the method.

Figure 2:
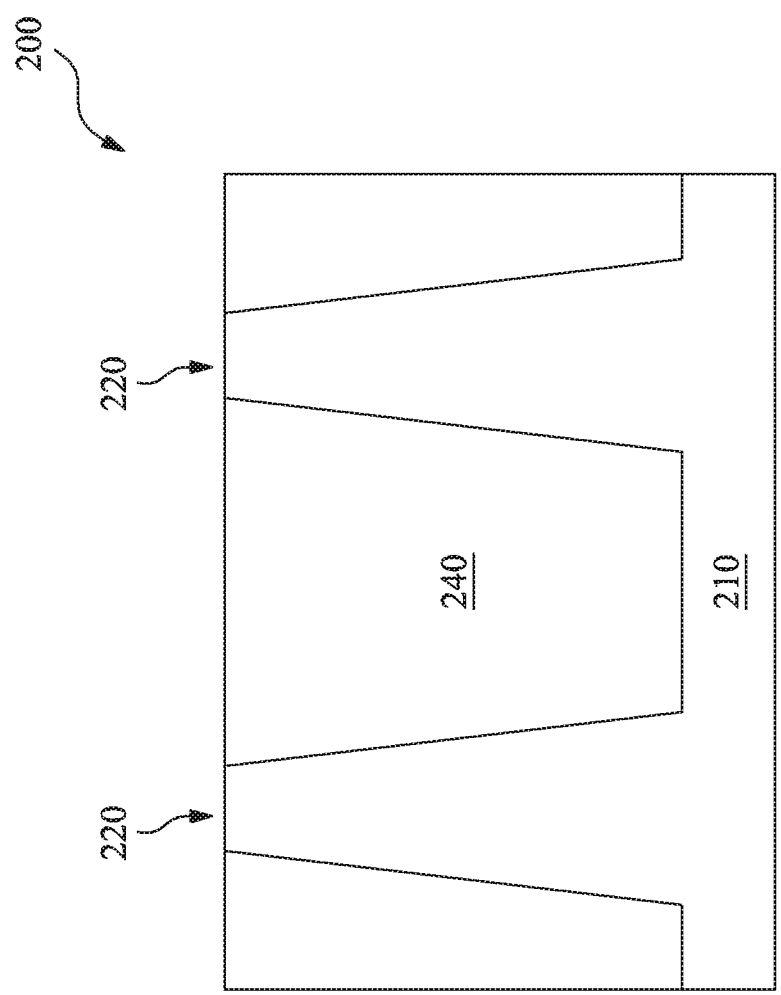
FIGS. 2 to 13 are cross-sectional views of an example FinFET device at fabrication stages constructed according to the method of FIG. 1.

Referring to FIGS. 1 and 2, the method 100 begins at step 102 by forming first fin structures 220 in a substrate 210. The substrate 210 includes silicon. In another embodiment, the substrate may include germanium, silicon germanium, gallium arsenide or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials.

The first fin structures 220 may be formed by one or more procedures such as deposition, lithography and etching. In one embodiment, a hard mask (HM) layer is formed over the substrate 210. The HM layer may include may include silicon nitride, silicon oxide, silicon carbide, titanium oxide, titanium nitride, tantalum oxide, tantalum nitride, or any suitable materials. A patterned photoresist layer is then formed over the HM layer to define first fin structures 220. Generally, a patterning process may include photoresist coating (e.g., spin-on coating), exposing, developing the photoresist, other suitable processes, or combinations thereof. Alternatively, the photolithography exposing process is implemented or replaced by other proper methods such as maskless photolithography, electron-beam writing, direct-writing, and/or ion-beam writing. The HM layer is then etched through the pattern photoresist layer to form a patterned HM layer 215. The substrate 210 is then etched through the patterned HM layer to form first fin structures 220.

The substrate 210 may be etched by various methods, including a dry etch, a wet etch, or a combination of thereof. In one embodiment, the wet etching solution includes a tetramethylammonium hydroxide (TMAH), a HF/HNO3/CH3COOH solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. Dry etching processes may include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

Referring also to FIGS. 1 and 2, the method 100 proceeds to step 104 by depositing a dielectric layer 240 over the substrate 210, including filling in spaces between each of first fin structures 220. In one embodiment, the dielectric layer 240 between each of the first fin structures 220 serves as an isolation region to separate various device regions in the substrate 210. The dielectric layer 240 may include silicon oxide, silicon nitride, oxynitride, a dielectric material having a dielectric constant (k) lower than thermal silicon oxide (therefore referred to as low-k dielectric material layer), or other suitable dielectric material layer. The dielectric layer 240 may include a single layer or multiple layers. The dielectric layer 240 may be deposited by chemical vapor deposition (CVD), atomic layer deposition (ALD) or spin-on coating. Additionally, a chemical mechanical polishing (CMP) process may be performed to planarize top surfaces of the dielectric layer 240 (and removed the patterned HM layer as well).

Figure 3:
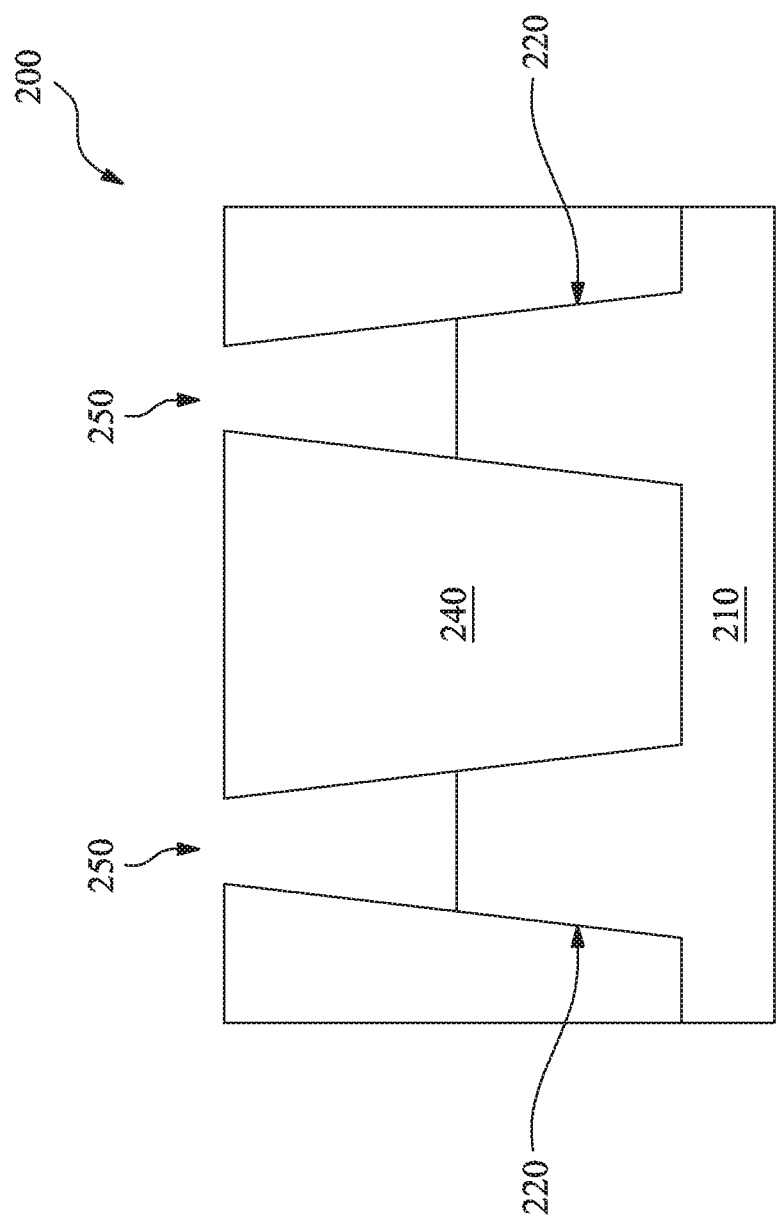

Referring to FIGS. 1 and 3, the method 100 proceeds to step 106 by recessing the first fin structures 220 to form a trench 250 in the dielectric layer 240. In one embodiment, a chemical mechanical polishing (CMP) process is performed first to remove excessive the dielectric layer 240 and expose a top surface of the first fin structure 220. The first fin structures 220 is then recessed by a selectively etch, which does not substantially etch the dielectric layer 240. The recessing process may include a selective wet etch or a selective dry etch, or combination thereof. In one embodiment, a selective wet etching solution includes a tetramethylammonium hydroxide (TMAH), a HF/HNO3/CH3COOH solution, or other suitable solution. Dry etching process may include a biased plasma etching process that uses a chlorine-based chemistry, such as such as $Cl_2$, $CHCl_3$, $CCl_4$, and/or $BCl_3$. The first trench 250 is formed to have the recessed first fin structure 220 at its bottom and the dielectric layer 240 as its sidewalls. In the other words, the recessed first fin structure 220 is exposed in the trench 250.

Figure 4:
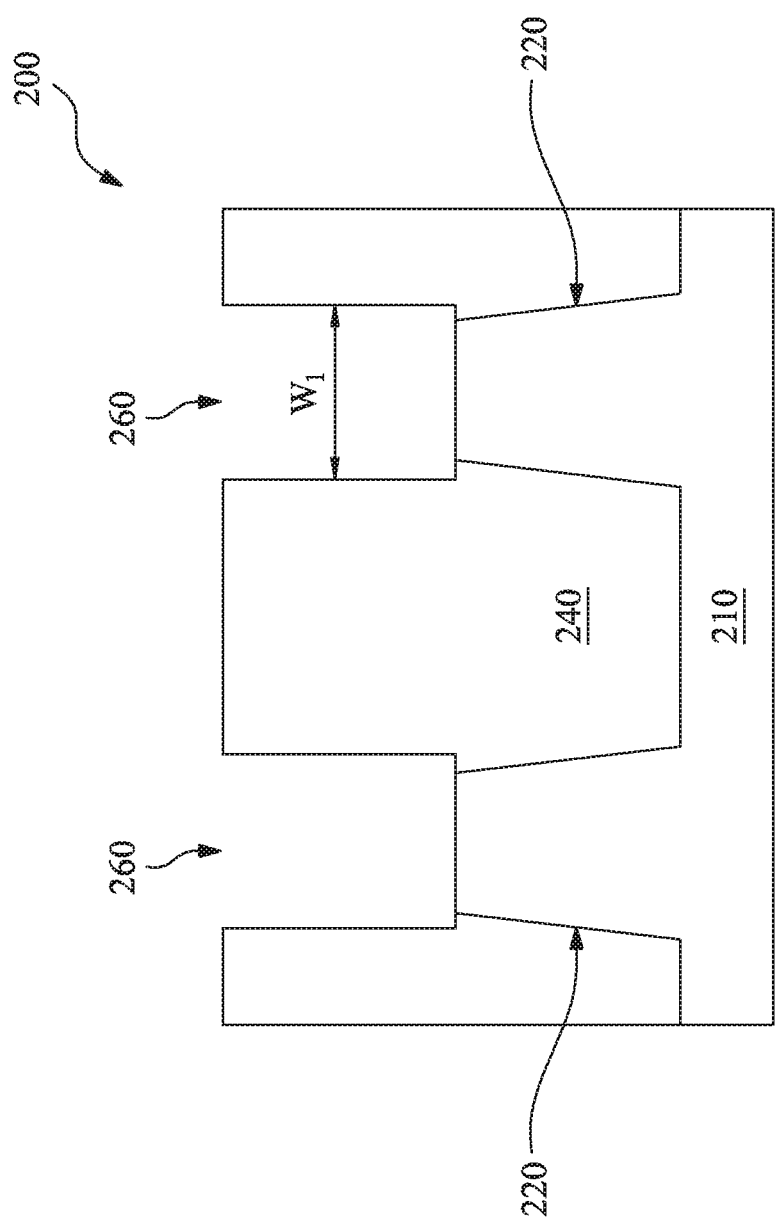

Referring to FIGS. 1 and 4, the method 100 proceeds to step 108 by enlarging the trench 250 to form an enlarged trench 260. In the present embodiment, the enlarged trench 260 has a substantially vertical profile. The enlarged trench 260 has a first width $w_1$. In one embodiment, the enlarged trench 260 is formed by etching the dielectric layer 240 through a patterned photoresist layer. The etching process includes an anisotropic etch. The anisotropic dielectric etch may include a plasma dry etching process using a fluorine-based chemistry, such as $CF_4$, $SF_6$, $CH_2F_2$, $CHF_3$, and/or $C_2F_6$. The anisotropic dielectric etch selectively removes the dielectric layer 240 but does not substantially etch the recessed first fin structures 220.

Figure 5:
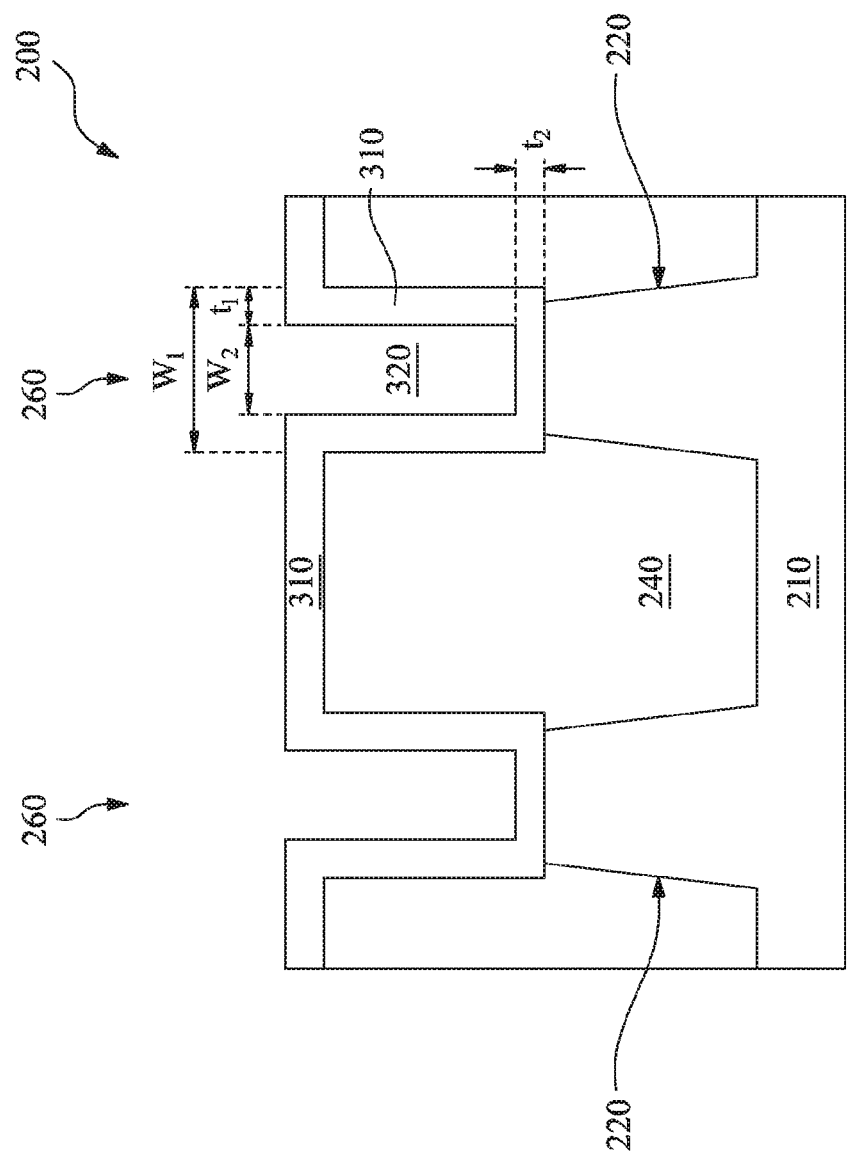

Referring to FIGS. 1 and 5, the method 100 proceeds to step 110 by conformably depositing a first semiconductor material layer 310 along sidewalls and bottom of the enlarged trench 260. The first semiconductor material layer 310 may include element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The first semiconductor material layer 310 may be deposited by epitaxial processes including CVD deposition techniques (e.g., vapor-phase epitaxy (VPE) and/or ultra-high vacuum CVD (UHV-CVD)), molecular beam epitaxy, and/or other suitable processes. In present embodiment, the first semiconductor material layer 310 includes epitaxial Si layer. The first semiconductor material layer 310 may be in-situ doped during the epi process. For example, the epitaxially grown semiconductor material layer 310 may be doped with boron. For another example, the epitaxially grown Si layer 310 may be doped with carbon, or phosphorous, or both carbon and phosphorous. In another embodiment, the first semiconductor layer 310 is not in-situ doped, an implantation process (i.e., a junction implant process) is performed.

In the present embodiment, the semiconductor material layer 310 is conformably covers vertical sidewalls of the enlarged trench 260 with a first thickness $t_1$ and the bottom of the enlarged trench 260 with a second thickness $t_2$. In one embodiment, the second thickness $t_2$ is thinner than the first thickness $t_1$. In another embodiment, the second thickness $t_2$ may be substantial same as the first thickness $t_1$. After deposition the first semiconductor material layer 310, the first width $w_1$ of the enlarged trench 260 is reduced to a second width $w_2$, which is $w_2=w_1-(2\times t_1)$. By choosing the first width $w_1$ and the thickness t, the second width $w_2$ is a targeted fin width, which will be described later.

Figure 6:
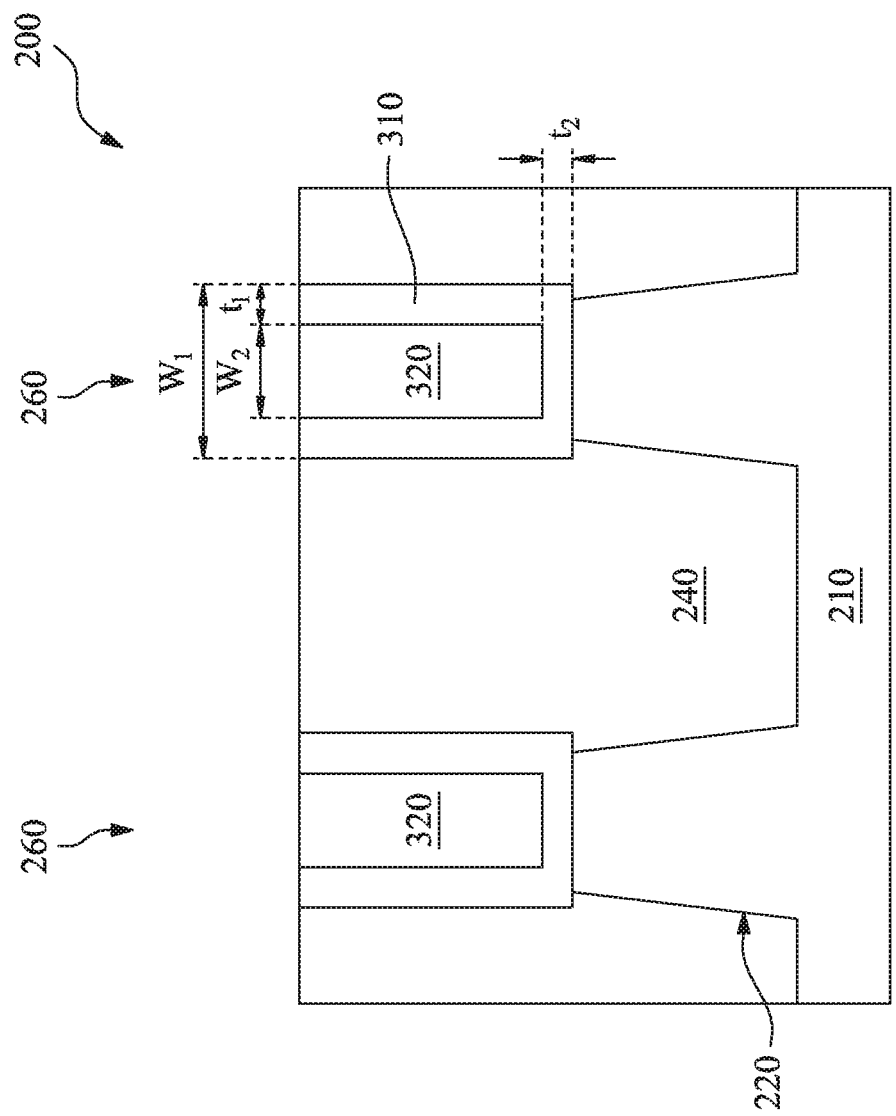

Referring to FIGS. 1 and 6, the method 100 proceeds to step 112 by epitaxially growing a second semiconductor layer 320 from bottom of the remaining enlarged trench 260. The second semiconductor layer 320 may include Ge, Si, GaAs, AlGaAs, SiGe, GaAsP, or other suitable materials. In the present embodiment, the second semiconductor layer 320 includes SiGe. The second semiconductor material layer 320 may be epitaxially grown by epitaxial processes including CVD, molecular beam epitaxy, and/or other suitable processes. The epitaxially grown second semiconductor material layer 320 fully fills in the remaining enlarged trench 260. Another CMP process is then performed to remove excessive the second and first semiconductor material layer, 310 and 320, and planarize the top surface of the second and first semiconductor material layer, 310 and 320, with the top surface of the dielectric layer.

The method 100 has two paths after step 112, identified by the suffix "A" and "B," respectively. Both paths are separately discussed below.

Figure 7:
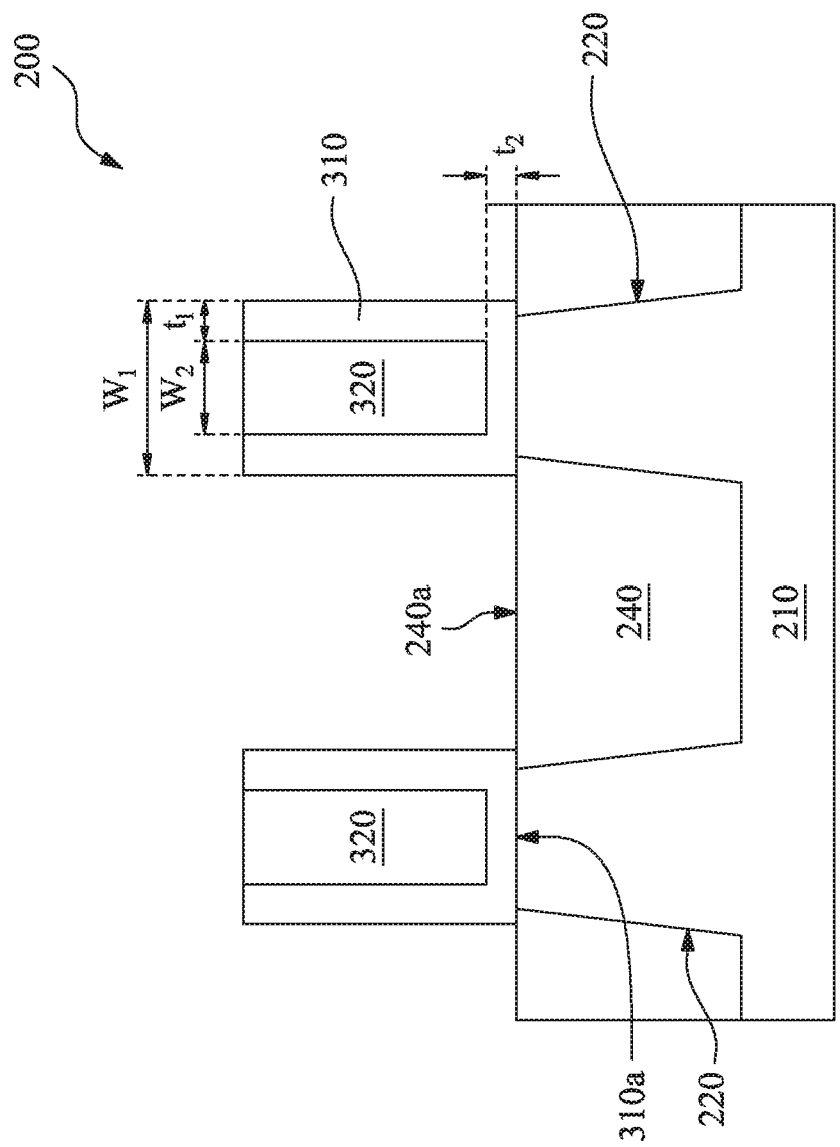

Referring to FIGS. 1 and 7, the method 100 proceeds along path A to step 114A by recessing the dielectric layer 240 to laterally expose the first semiconductor material layers 310. The dielectric layer 240 is recessed by a proper etching process, such as a selective wet etch, or a selective dry etch, or a combination thereof. The etching selectively removes dielectric layer 240 but does not substantially etch the first and second semiconductor material layers, 310 and 320. In present embodiment, the recessing processes are controlled to make a top surface 240a of the recessed dielectric material layer 240 below a bottom surface 310a of the semiconductor material layers 310.

Figure 8:
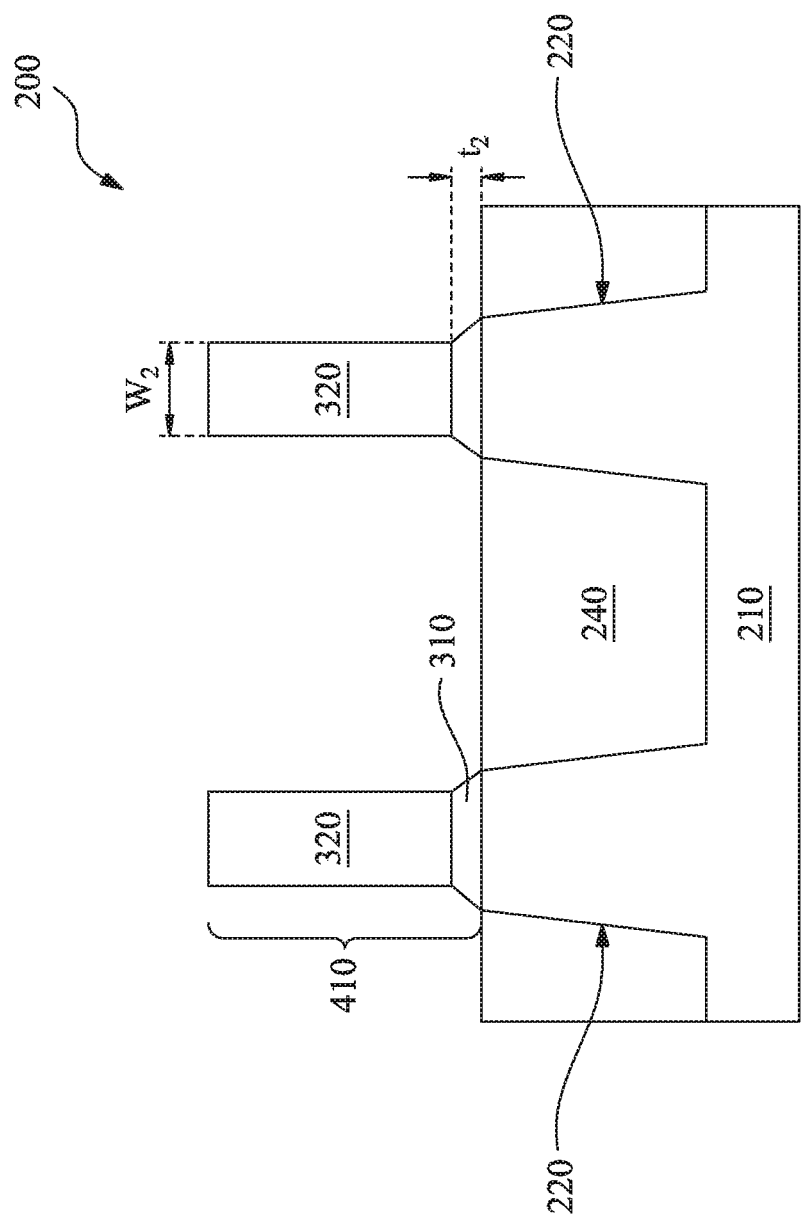

Referring to FIGS. 1 and 8, the method 100 proceeds to step 116A by etching the exposed first semiconductor material layer 310. In the present embodiment, the exposed first semiconductor material layer 310 is etched by a selective etch such that the etching process does not substantially etch the second semiconductor material layer 320. Thus, the vertical sidewall profile of the second semiconductor material layer 320 remains intact. In one embodiment, the Si layer 310 is etched by a wet etch solution of $NH_4OH:H_2O_2$, with a high selectivity with respect to the SiGe layer 320. In another embodiment, the Si layer 310 is etched by a wet etch solution of TMAH. The etching process is controlled that the exposed first semiconductor material layer 310 along sidewalls of the second semiconductor material layer 320 are fully removed while at least a portion of the first semiconductor material layer 310 underneath the second semiconductor material layer 320 partially remains intact.

In the present embodiment, the second semiconductor material layer 320 combining with the remaining the first semiconductor material layer 310 underneath of it forms a second fin structure 410. Thus, the second fin structure 410 has the second semiconductor material layer 320 as its upper portion and the first semiconductor material layer 310 as its lower portion. The second semiconductor material layer 320 of the upper portion has vertical sidewall profiles, while the first semiconductor material layer 310 of the lower portion has non-vertical sidewall profile, such as it has a wider width at its bottom. Here, the non-vertical sidewall profile of the first semiconductor material layer 310 of the lower portion is sloped and/or tapered. A width of the upper portion, referred to as a width of the second fin structure 410, is the second width $w_2$. As mentioned previously, $w_2=w_1-(2\times t_1)$. Therefore a targeted small fin structure width can be achieved by choosing the first width $w_1$ and the first thickness $t_1$. A width of the lower portion is equal or less than the second width $w_2$.

Figure 9:
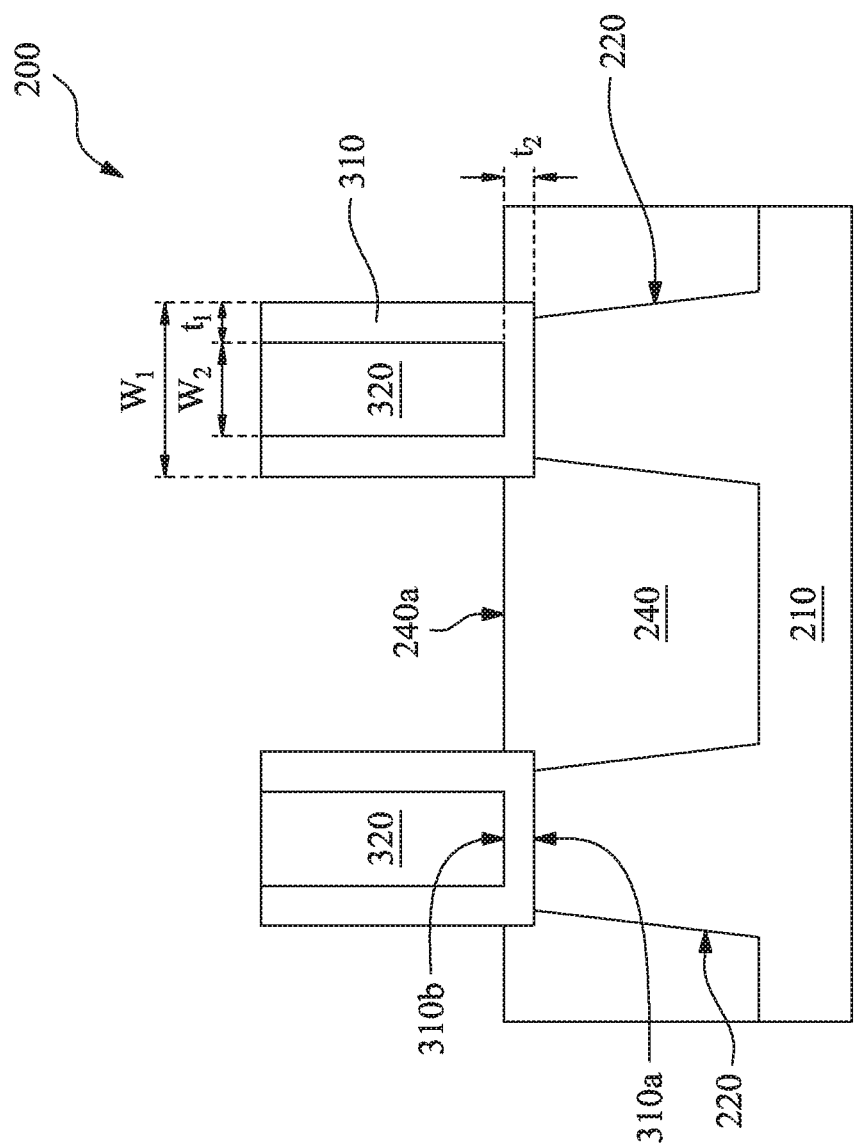

Referring to FIGS. 1 and 9, alternatively, after completing the step 112, the method 100 proceeds along path B to step 114B (instead of 114A) by recessing the dielectric layer 240 to laterally expose the second semiconductor material layer 320. The recess is similar in many respects to those discussed above in step 114A. But the recessing depth is controlled to make a top surface 240a of the recessed dielectric material layer 240 to be positioned above the bottom surface 310a of the first semiconductor material layer 310. Here, the top surface 240a of the recessed dielectric material layer 240 is at the same horizontal level as a top surface 310b of the first semiconductor material layers 310 that opposes the bottom surface 310a of the first semiconductor material layer 310.

Figure 10:
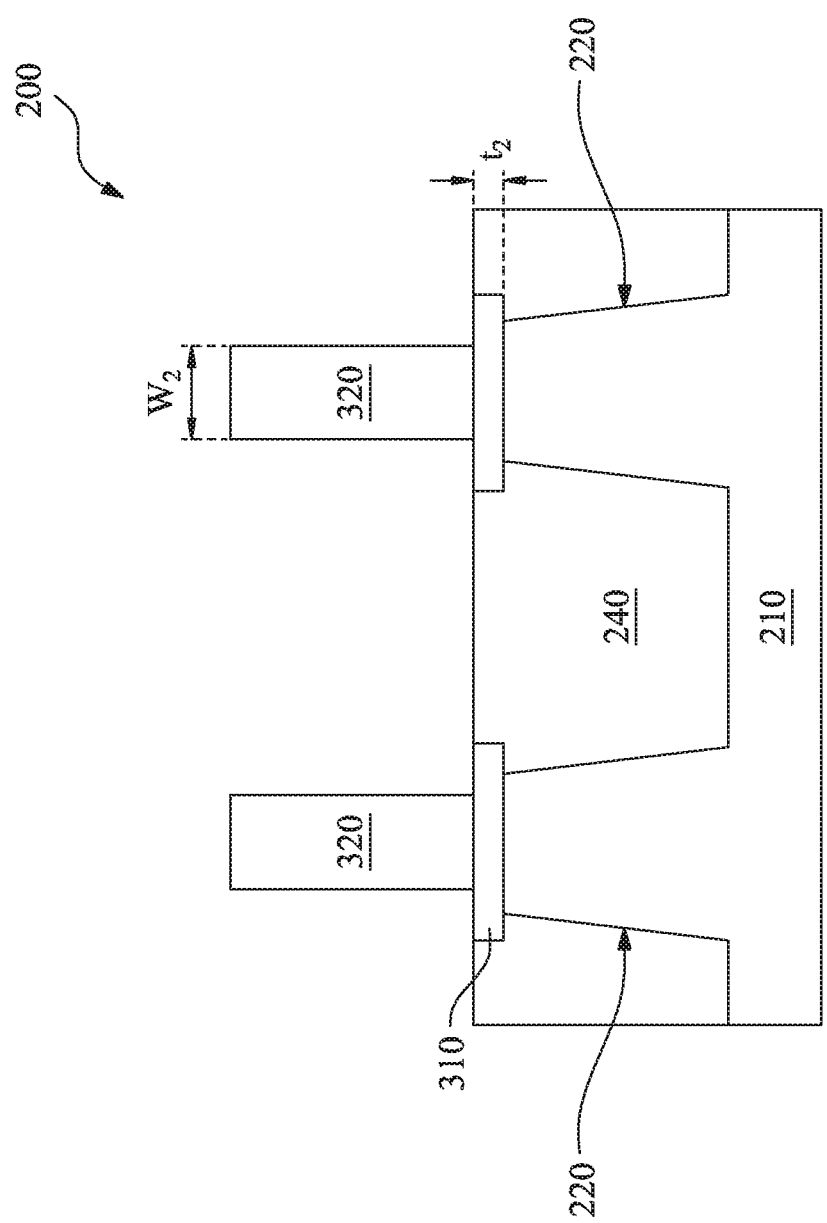

Referring to FIGS. 1 and 10, the method 100 proceeds to step 116B by etching the exposed first semiconductor material layer 310. The step 116B is similar in many respects to step 116A. A selective etching process is performed and the exposed first semiconductor material layer 310 along sidewalls of the second semiconductor material layer 320 is removed while the second semiconductor material layer 320 remains un-etched. Thus, the vertical sidewall profile of the second semiconductor material layer 320 remains intact. Also, with an adequate selective etching of the first semiconductor material layer 310 with respect to the second semiconductor material layer 320 and the dielectric layer 240, a portion of the first semiconductor material layer 310, which is underneath the second semiconductor material layer 320 remains intact during the recessing process.

Figure 11:
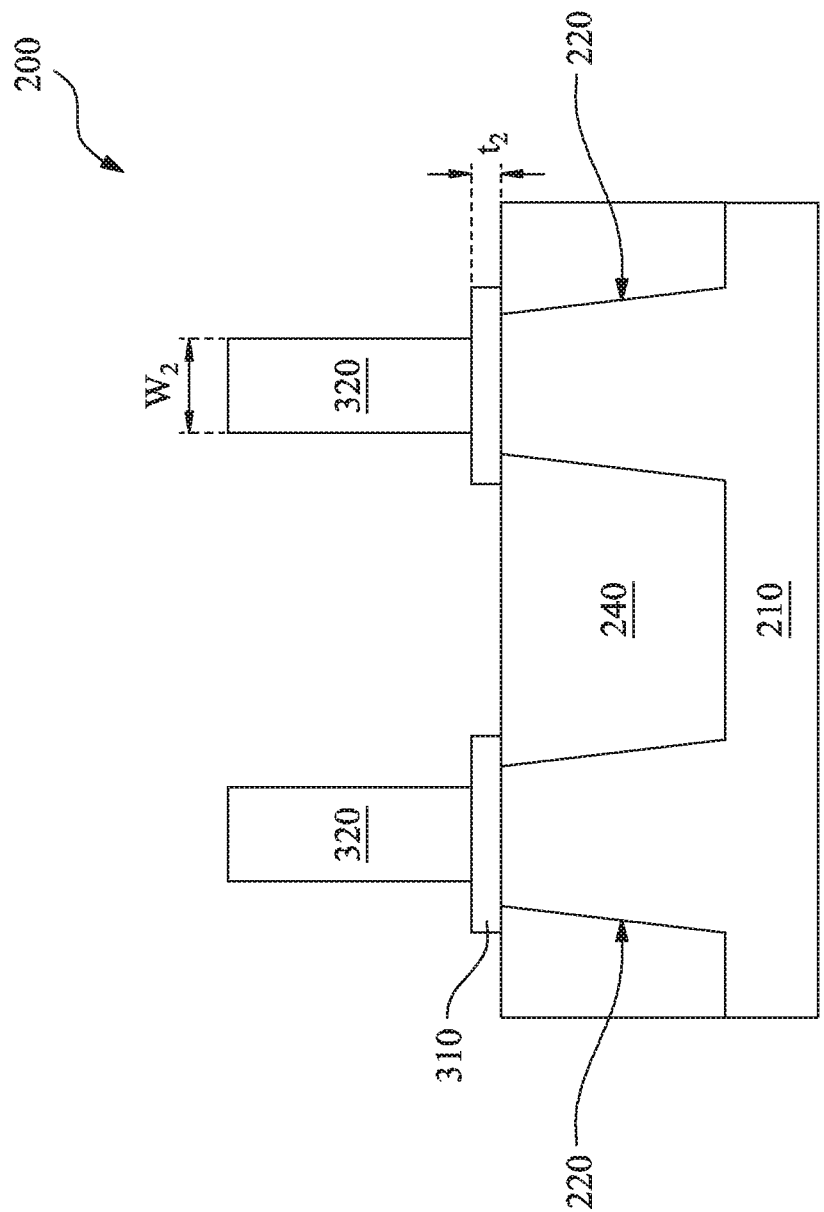

Referring to FIGS. 1 and 11, the method 100 proceeds to step 118B by recessing the dielectric layer 240 further to expose the remaining portion of the first semiconductor material layer 310 underneath the second semiconductor material layer 320. The recessing process is similar in many respects to those discussed above in step 114B.

Referring to FIGS. 1 and 12A-12C, the method 100 proceeds to step 120B by trimming the remaining portion of the first semiconductor material layer 310. The trimming process is similar in many respects to those discussed above in step 116A. In the present embodiment, the trimming process is a selective etch, which selective trims the remaining portion of the first semiconductor material layer 310 but does not substantially etch second semiconductor material layer 330. Thus, the vertical sidewall profile of the second semiconductor material layer 320 remains intact.

Figure 12A:
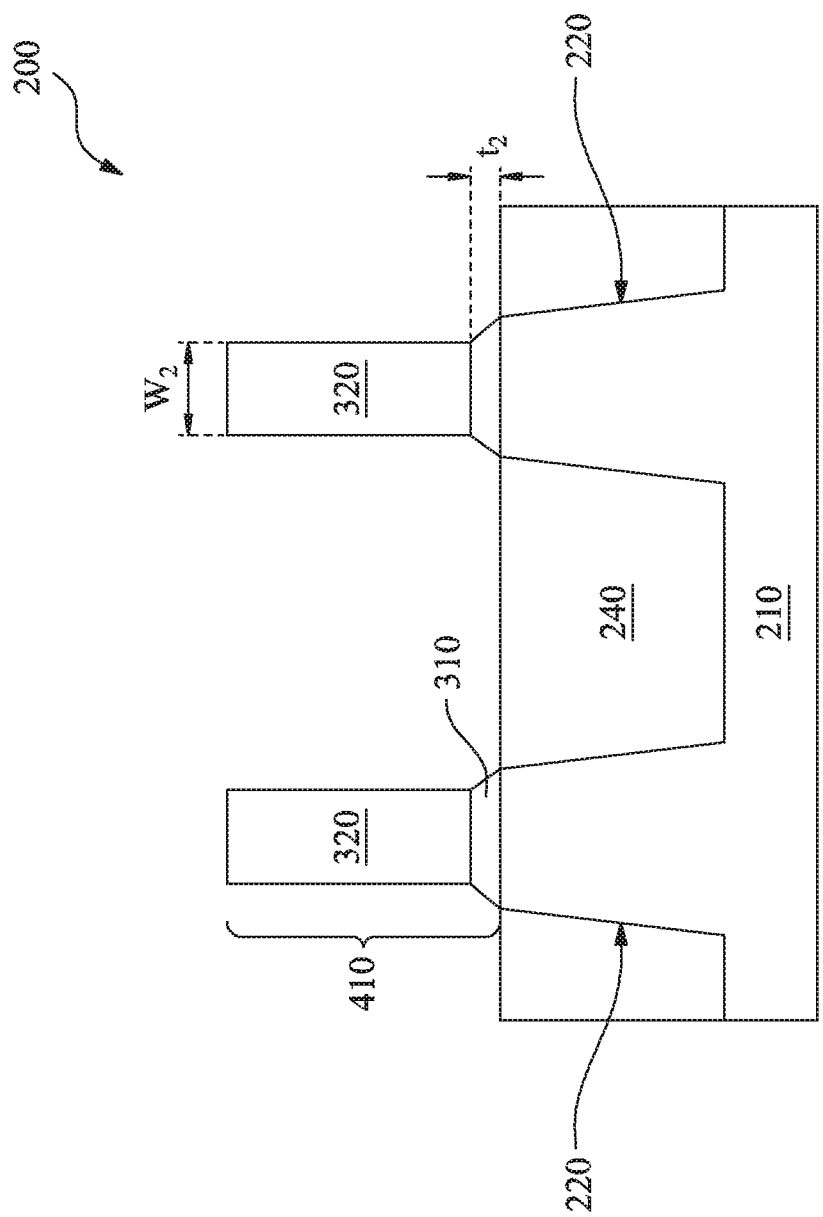
Figure 12B:
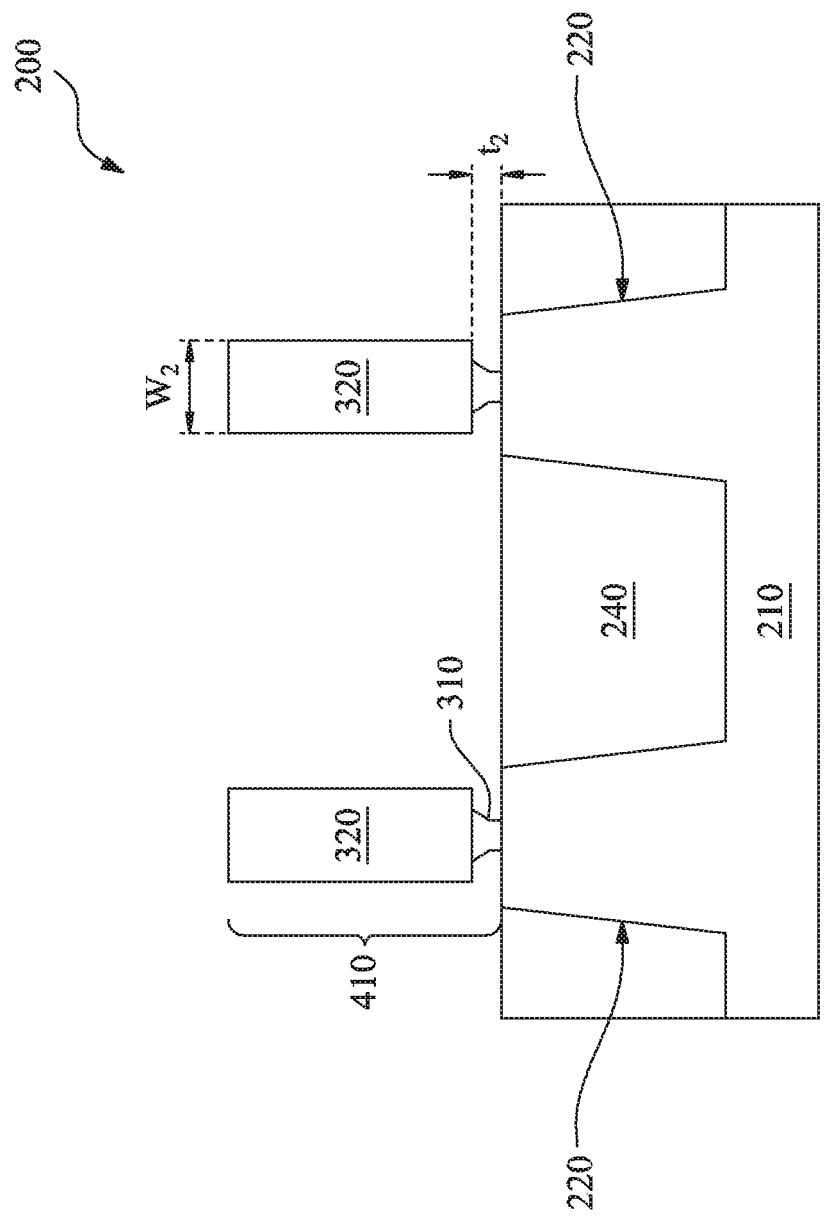
Figure 12C:
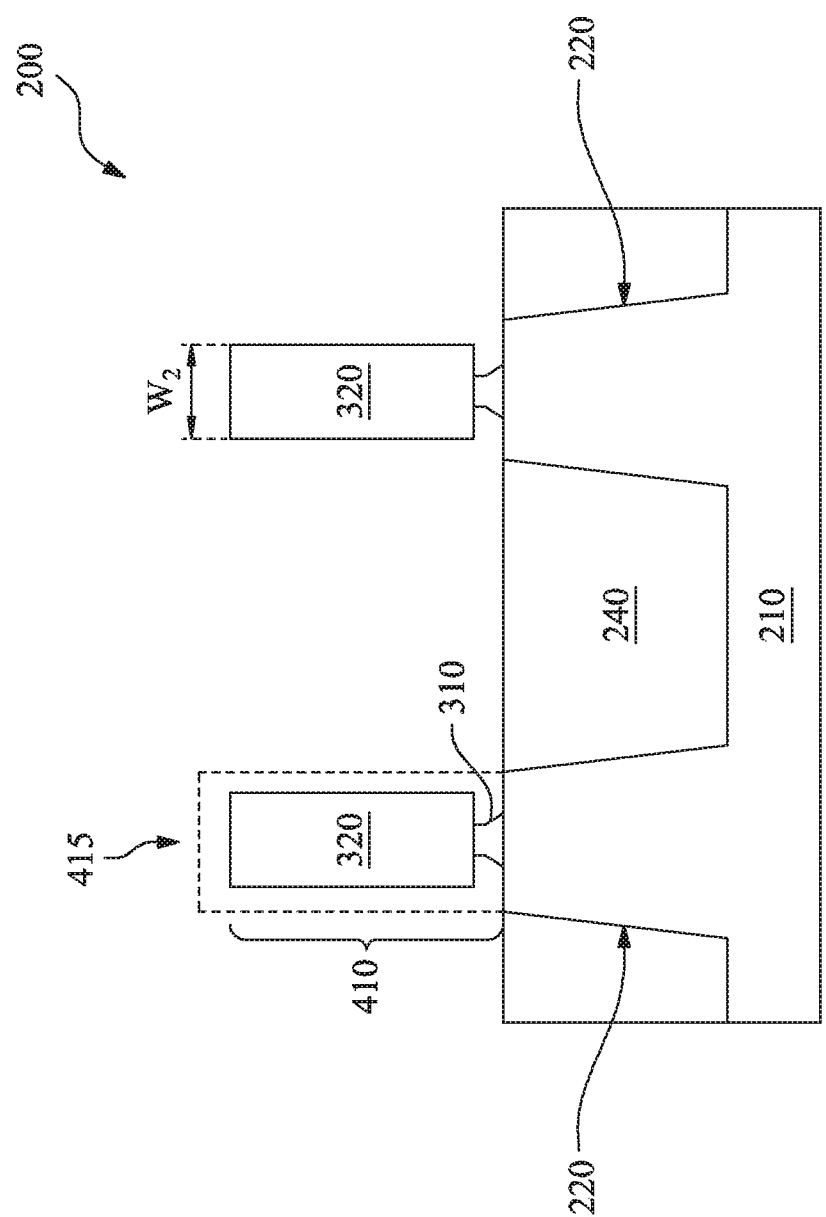

As mentioned in step 116A, the second fin structure 410 is formed having the second semiconductor material layer 320 as its upper portion and the first semiconductor material layer 310 as its lower portion. The upper portion has vertical sidewall profiles and the second width $w_2$. The lower portion has non-vertical sidewall profile. By controlling trimming process, such as trimming time, trimming process conditions, various shapes of the lower portion of the second fin structure 410 can be achieved to meet various device requirements. In one embodiment, the lower portion of the second fin structure 410 is formed with a keystone shape, which has a wider width at its bottom, as shown in FIG. 12A. In another embodiment, with a longer trimming time, the lower portion of the second fin structure 410 is formed with a necking-shape, which has a narrowest width in the middle, as shown in FIG. 12B. In yet another embodiment, the necking-shape lower portion of the second fin structure 410 is trimmed further to make the second fin structure have a Ω-shape 415, as shown in FIG. 12C. A gate-all-around (GAA) gate will be formed over the Ω-shape second fin structure 410, which will be described later.

The FinFET device 200 may also undergo further CMOS or MOS technology processing to form various features, such as source/drain (S/D) features and gate stacks. The second fin structure 410 includes source/drain (S/D) regions and gate regions. S/D features are formed in the S/D regions and gate stacks are formed in the gate regions of the second fin structure 410. In one embodiment, a dummy gate stacks are formed first on the substrate 210 and is partially disposed over the second fin structure 410 in the gate regions. The dummy gate stacks will be replaced by the final gate stack at a subsequent stage. Particularly, the dummy gate stacks are to be replaced later by a high-k dielectric layer (HK) and metal gate electrode (MG) after high thermal temperature processes, such as thermal annealing for S/D activation during the sources/drains formation.

The S/D features are then formed over the S/D regions in the second fin structure 410. In one embodiment, the upper portion of the second fin structure 410 in the S/D region is recessed and the S/D features then epitaxially grow on the recessed second fin structure 410. The S/D features include Ge, Si, GaAs, AlGaAs, SiGe, GaAsP, or other suitable material. The S/D features may also be doped, such as being in-situ doped during the epitaxial growing processes. Alternatively, the S/D features are not in-situ doped and implantation processes (i.e., a junction implant process) are performed to dope the S/D features.

The following descriptions will be directed to the embodiment of FIG. 12C, for the sake of example. It is understood that similar processes can be implemented on embodiments of FIGS. 8 and 12A-12B.

Figure 13:
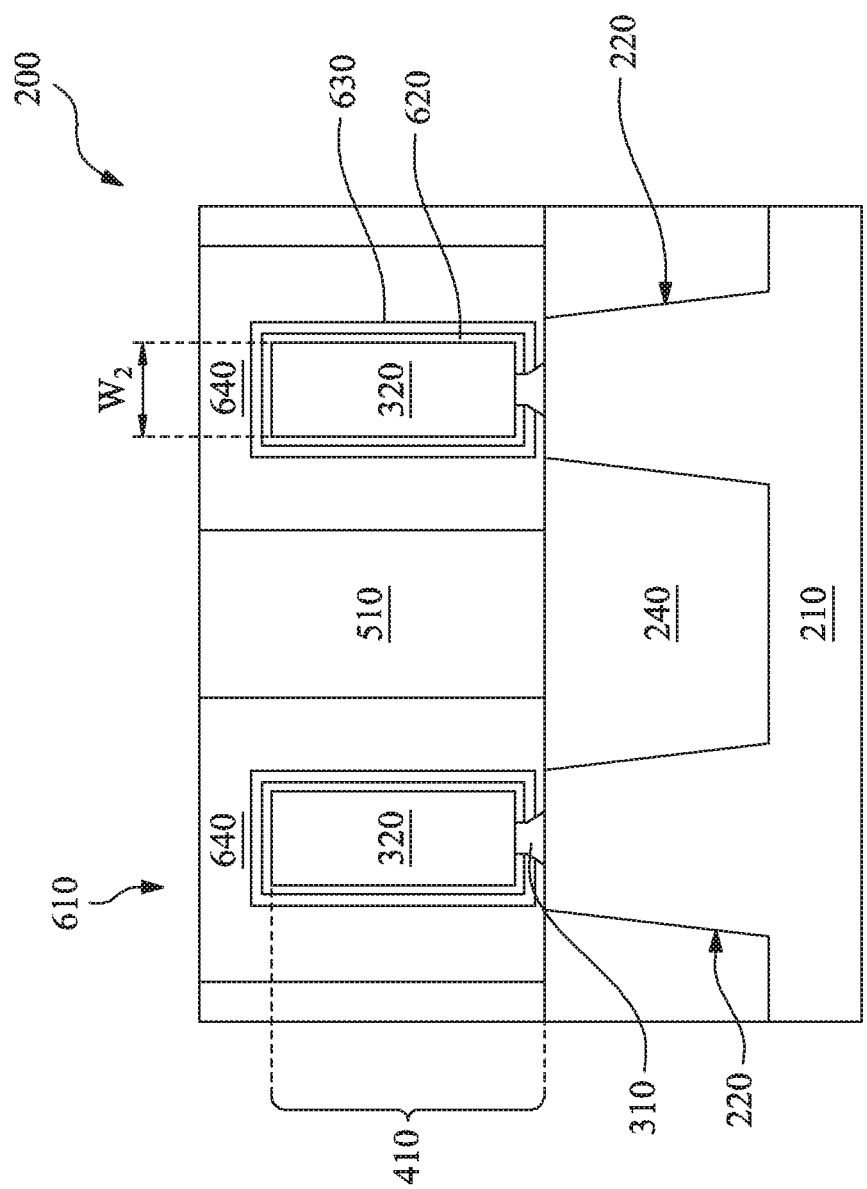

Now referring to FIG. 13, an interlayer dielectric (ILD) layer 510 is formed over the substrate 210 between the second fin structures 410. The ILD layer 510 includes silicon oxide, silicon oxynitride, low k dielectric material or other suitable dielectric materials. The ILD layer 510 may include a single layer or alternative multiple layers. The ILD layer 510 is formed by a suitable technique, such as CVD, ALD and spin-on (SOG). A CMP process may be performed thereafter to remove excessive ILD layer 510 and planarize the top surface of the FinFET device 200.

The dummy gate stacks are then replaced by high-k/metal gate (HK/MG) stacks 610 are formed over the substrate 210, including wrapping over a portion of the second fin structure 410. The HK/MG stacks 610 may include gate dielectric layer and gate electrode on the gate dielectric. In one embodiment, the gate dielectric layer includes a dielectric material layer having a high dielectric constant (HK dielectric layer-greater than that of the thermal silicon oxide in the present embodiment) and the gate electrode includes metal, metal alloy or metal silicide. The formation of the HK/MG stacks 610 includes depositions to form various gate materials and a CMP process to remove the excessive gate materials and planarize the top surface of the FinFET device 200.

In one embodiment, the gate dielectric layer includes an interfacial layer (IL) 620 deposited by a suitable method, such as atomic layer deposition (ALD), CVD, thermal oxidation or ozone oxidation. The IL 620 may include oxide, HfSiO and oxynitride. A HK dielectric layer 630 is deposited on the IL 620 by a suitable technique, such as ALD, CVD, metal-organic CVD (MOCVD), physical vapor deposition (PVD), other suitable technique, or a combination thereof. The HK dielectric layer 630 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitride (SiON), or other suitable materials. The gate dielectric layers wrap over the second fin structures 410 in the gate region.

Metal gate (MG) electrodes 640 are formed over the HK dielectric layer 630. The MG electrodes 640 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode 640 may be formed by ALD, PVD, CVD, or other suitable process. A CMP process may be performed to remove excessive MG electrode 640.

Subsequent processing may also form various contacts/vias/lines and multilayers interconnect features (e.g., metal layers and interlayer dielectrics) on the substrate 210, configured to connect the various features or structures of the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional steps can be provided before, during, and after the method 100, and some of the steps described can be replaced or eliminated for other embodiments of the method.

Based on the above, the present disclosure offers methods and structures for a FinFET device. The method employs forming a fin structure with a quite small width without trimming the fin structure itself to improve fin structure shape and critical dimension (CD) control. The method also employs forming the fin structure with a desirable vertical profile at its upper portion. The method also employs forming various shape of the lower portion of the fin structure to meet various device requirements, such as for a gate-all-around device.

The present disclosure provides many different embodiments of fabricating a FinFET device that provide one or more improvements over the prior art. In one embodiment, a method for fabricating a FinFET device includes forming a first fin structure over a substrate, forming a dielectric layer over the first fin structure, forming a trench within the dielectric layer, wherein the first fin structure is exposed in a bottom of the trench, depositing a first semiconductor material layer within the trench, depositing a second semiconductor material layer over the first semiconductor material layer within the trench, recessing the dielectric layer to laterally expose the first semiconductor material layer and etching the exposed first semiconductor material layer to reveal the second semiconductor material layer, wherein at least a portion of the first semiconductor material layer underneath the second semiconductor material layer remains intact.

In yet another embodiment, a method for fabricating a FinFET device includes A method for fabricating a fin-type field-effect transistor (FinFET) device, the method includes forming a first fin structure, surrounding by a dielectric layer, over a substrate, recessing the first fin structure to form a trench in the dielectric layer, enlarging the trench to have a vertical sidewall profile, depositing conformably a first semiconductor material layer over sidewalls and bottom of the trench, epitaxially growing a second semiconductor material from bottom of the remaining trench, recessing the dielectric layer to laterally expose the first semiconductor material layer, removing the exposed first semiconductor material layer along the sidewall of the second semiconductor material layer, but does not substantially etch the second semiconductor material layer. At least a portion of the first semiconductor material layer underneath the second semiconductor material layer remains intact. The method also includes forming a high-k/metal gate over the substrate, including wrapping over the second semiconductor material layer and the remaining first semiconductor material layer underneath the second semiconductor material layer.

In another embodiment, a FinFET device includes a first fin structure disposed over a substrate, a second fin structure disposed over the first fin structure. The second fin structure includes a first semiconductor material layer as its lower portion and a second semiconductor material layer having a vertical sidewall profile as its upper portion. The device also includes a high-k/metal gate (HK/MG) disposed over the substrate, including wrapping over the second fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first fin structure extending from a semiconductor substrate;
   a second fin structure disposed over the first fin structure, the second fin structure including:
      a first layer including a first semiconductor material; and
      a second layer including a second semiconductor material disposed over the first layer, the second layer having a vertical sidewall, wherein the second semiconductor material is different from the first semiconductor material; and
   a gate structure disposed over the semiconductor substrate, the gate structure wrapping around the first and second layers of the second fin structure.

2. The semiconductor device of claim 1, wherein the first semiconductor material includes silicon and the second semiconductor material includes silicon germanium.

3. The semiconductor device of claim 1, wherein the first layer has a tapered sidewall.

4. The semiconductor device of claim 1, wherein the first layer provides a first width of the second fin structure, and the second layer provides a second width of the second fin structure, and
   wherein the first width is less than the second width.

5. The semiconductor device of claim 4, wherein a top portion of the first layer provides the first width of the second fin structure,
   wherein a bottom portion of the first layer provides a third width of the second fin structure, and
   wherein the third width is less than the second width.

6. The semiconductor device of claim 5, wherein the first width is less than the third width.

7. The semiconductor device of claim 5, wherein the first width is greater than the third width.

8. A semiconductor device comprising:
   a first fin structure extending from a substrate;
   a second fin structure disposed over the first fin structure, the second fin structure including:
      a lower portion including a first semiconductor material, wherein the lower portion has a tapered sidewall; and
      an upper portion including a second semiconductor material, wherein the second semiconductor material is different from the first semiconductor material; and
   a gate structure disposed over the first and second fin structures.

9. The semiconductor device of claim 8, wherein the first semiconductor material is silicon and the second semiconductor material is silicon germanium.

10. The semiconductor device of claim 8, wherein the gate structure includes:
    a gate dielectric layer wrapping around the second fin structure; and
    a metal gate electrode wrapping around the gate dielectric layer.

11. The semiconductor device of claim 10, wherein a portion of the metal gate electrode is disposed vertically under a bottom surface of the upper portion of the second fin structure.

12. The semiconductor device of claim 11, wherein the portion of the metal gate electrode is disposed vertically over a top surface of the first fin structure.

13. The semiconductor device of claim 8, wherein the upper portion of the second fin structure has a vertical profile.

14. The semiconductor device of claim 13, wherein a widest width of the lower portion is less than a width of the upper portion.

15. The semiconductor device of claim 13, wherein a widest width of the lower portion is greater than a width of the upper portion.

16. A semiconductor device comprising:
    a first fin structure extending from a substrate;
    a second fin structure disposed over the first fin structure, the second fin structure including:
       a lower portion including a first semiconductor material, wherein the lower portion has a tapered sidewall; and
       an upper portion including a second semiconductor material, wherein the second semiconductor material is different from the first semiconductor material; and
    a gate structure disposed over the substrate, wherein a portion of the gate structure is disposed vertically under a bottom surface of the upper portion of the second fin structure.

17. The semiconductor device of claim 16, wherein the first semiconductor material is silicon and the second semiconductor material is silicon germanium.

18. The semiconductor device of claim 16, wherein the lower portion provides a first width of the second fin structure, and the upper portion provides a second width of the second fin structure, and
    wherein the first width is less than the second width.

19. The semiconductor device of claim 16, wherein the portion of the gate structure includes a metal gate electrode disposed vertically under the bottom surface of the upper portion of the second fin structure.

20. The semiconductor device of claim 19, wherein the metal gate electrode is disposed vertically over a top surface of the first fin structure.

* * * * *